(12) United States Patent
Meguro et al.

(10) Patent No.: US 7,867,881 B2
(45) Date of Patent: Jan. 11, 2011

(54) METHOD OF MANUFACTURING NITRIDE SEMICONDUCTOR SUBSTRATE

(75) Inventors: Takeshi Meguro, Kitaibaraki (JP); Takayuki Suzuki, Hitachi (JP); Ken Ikeda, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 83 days.

(21) Appl. No.: 12/397,544

(22) Filed: Mar. 4, 2009

(65) Prior Publication Data
US 2009/0233423 A1 Sep. 17, 2009

(30) Foreign Application Priority Data
Mar. 4, 2008 (JP) .............................. 2008-052902

(51) Int. Cl.
H01L 21/20 (2006.01)
H01L 21/36 (2006.01)

(52) U.S. Cl. ............................... 438/479; 257/E21.121

(58) Field of Classification Search ................. 438/479, 438/482; 257/E21.121
See application file for complete search history.

(56) References Cited

U.S. PATENT DOCUMENTS 6,652,648 B2 11/2003 Park

2005/0093003 A1* 5/2005 Shibata .......................... 257/79
2007/0040219 A1* 2/2007 Shibata ........................ 257/352

FOREIGN PATENT DOCUMENTS

JP 2002-57119 A1 2/2002

OTHER PUBLICATIONS

Oshima, Yuichi et al.: Preparation of Freestanding GaN Wafers by Hydride Vapor Phase Epitaxy with Void-Assisted Separation; Jpn. J. Appl. Phys., vol. 42 (2003), pp. L1-L3; Part 2, No. 1A/B, Jan. 15, 2003.

* cited by examiner

*Primary Examiner*—Matthew S Smith
*Assistant Examiner*—Christine Enad
(74) *Attorney, Agent, or Firm*—Martin Fleit; Paul D. Bianco; Fleit Gibbons Gutman Bongini & Bianco PL

(57) ABSTRACT

A method for manufacturing a nitride semiconductor substrate including the steps of: forming a nitride semiconductor layer on a sapphire substrate, and manufacturing a freestanding nitride semiconductor substrate by using the nitride semiconductor layer separated from the sapphire substrate, wherein variability of inclinations of the C-axes, being a difference between a maximum value and a minimum value of inclination of the C-axes in a radially-outward direction at each point on a front surface of the sapphire substrate is 0.3° or more and 1° or less.

3 Claims, 2 Drawing Sheets (a) After growth
(C-axes shown by arrows)

(b) After separation (c) After polishing (a) After growth
(main plain directions shown by arrows)

(b) After separation (c) After polishing

METHOD OF MANUFACTURING NITRIDE SEMICONDUCTOR SUBSTRATE

TECHNICAL FIELD

The present invention relates to a method for manufacturing a nitride semiconductor substrate, and further specifically relates to the method for manufacturing the nitride semiconductor substrate capable of manufacturing a freestanding substrate having a small variability of off-angles, composed of, for example, $In_xAl_yGa_{1-x-y}N$ ($0 \leq X$, $0 \leq Y$, $0 \leq X+Y \leq 1$).

BACKGROUND ART

A nitride semiconductor material such as gallium nitride (GaN), indium gallium nitride (InGaN), aluminum gallium nitride (GaAlN) has a large forbidden band width, and interband transition is a direct transition. Therefore, development of a short wavelength light emitting element for use in a visible light and an ultraviolet light is progressed.

In a nitride semiconductor substrate, a vapor pressure of nitrogen is extremely high, and therefore a bulky crystal growth from a melt is extremely difficult. For this reason, as a mainly used method for manufacturing the nitride semiconductor substrate, as shown in FIG. 4, a nitride semiconductor layer 22 is hetero-epitaxially grown on a heterogeneous substrate 21 different from a nitride semiconductor such as a sapphire substrate, a silicon substrate, or a gallium arsenide substrate by mainly using a vapor growth method (FIG. 4(a)), and thereafter the heterogeneous substrate 21 is removed by using a method such as separating, polishing or etching (FIG. 4(b)), and front/back surfaces of the nitride semiconductor layer 22 formed on the heterogeneous substrate 21 are subjected to polishing, etc, to thereby obtain a so-called "freestanding substrate" (FIG. 4(c)). Note that arrows in FIG. 4 show main plane directions of crystal, such as the C-axes in sapphire and GaN.

Thus, as a specific method of manufacturing the freestanding substrate, for example, a method described in patent document 1 is known.

Regarding a growth method of a nitride semiconductor layer, as described above, the nitride semiconductor layer is hetero-epitaxially grown on the heterogeneous substrate different from the nitride semiconductor. Therefore, a large crystal lattice distortion occurs at an initial time of growth due to a large difference in lattice constant, resulting in generating a dislocation density of $10^9$ to $10^{10}$ cm$^{-2}$. Such crystal defects cause a remarkable lowering of reliability of a light emitting device such as an LD (Laser diode) and an LED (Light emitted diode). Therefore, the dislocation density must be reduced.

In recent years, as a method of reducing density of such a defect, a growth technique such as ELO (epitaxial lateral overgrowth), FIELO (facet initiated epitaxial lateral overgrowth), and Pendeo epitaxy growth, are reported. By these growth techniques, propagation of dislocation from a base crystal is prevented, by forming a mask patterned with $SiO_2$, etc, on GaN grown on a substrate such as sapphire, then making a GaN crystal further selectively grown from a window part of the mask, and covering the surface of the mask with GaN by its lateral growth. Owing to such a development of the growth technique, the dislocation density in GaN can be tremendously reduced to about $10^7$ cm$^{-2}$.

Further, there are proposed various methods in which a GaN layer, with dislocation density reduced, is epitaxially grown thick on the heterogeneous substrate such as the sapphire substrate, which is then separated from the base after growth, and the GaN layer is used as a freestanding GaN substrate. For example, there is proposed a method such that the GaN layer is formed on the sapphire substrate by using the aforementioned ELO technique, and thereafter the sapphire substrate is removed by etching, etc, to thereby obtain a GaN freestanding substrate.

In addition, VAS (Void-assisted Separation: for example, see non-patent document 1) and DEEP (Dislocation Elimination by the Epi-growth with inverted-Pyramidal pits: for example, see non-patent document 2), etc, are disclosed. VAS makes it possible to realize both separation and low dislocation of a GaN layer simultaneously, by growing the GaN layer via a void layer and a TiN thin film having a net structure on a base substrate such as a sapphire substrate, etc. Also, by this DEEP, GaN is grown on the GaAs substrate that can be removed by etching, etc, by using a patterned mask made of SiN, etc, then a plurality of pits surrounded by facets are purposely formed on a bottom of the pits, and dislocations are accumulated on the bottom of the pits, to thereby obtain a low dislocation in other region.

(Patent Document 1)
Japanese Patent Laid Open Publication No. 2002-57119
(Non-patent document 1)
Y. Oshima et. al., Jpn. J. Appl. Phys., Vol. 42 (2003), pp. L1-L3
(Non-Patent Document 2)
K. Motoki et. al., Jpn. J. Appl. Phys., Vol. 40 (2001), pp. L140-L143

DISCLOSURE OF THE INVENTION

Problem to be Solved by the Invention

However, difference in defect density exists on the front/back surfaces of the nitride semiconductor layer 22 manufactured by the aforementioned conventional method. Therefore, distortion of crystal lattice occurs and internal stress is generated, thus causing the back surface 22b of the nitride semiconductor substrate layer 22 after being separated from the base substrate 21, to be warped in a convex shape (bulged shape of a center portion) toward the back side (FIG. 4(b)). Such a warped nitride semiconductor layer 22 has a problem that even if flattening process is applied thereto by polishing, etc, variability of off-angles of a freestanding nitride semiconductor substrate 23 occurs in a plane, because a plane direction is not directed in a uniform direction at each position in the plane of a front surface 22a (FIG. 4(c)). The off-angles here mean "angles of deviation of a normal line at each position of the front surface, from a main plane direction" (or "angles between the front surface and a main crystal plane at each position"), and the "variability of the off-angles" mean a state that "angles of deviation from the main plane direction are not uniform but are different, depending on in-plane positions.

When the variability of the in-plane off-angles occurs, variability of light emission wavelengths of a light emitting element device formed thereon is largely influenced thereby, and a processing yield is extremely lowered.

Further, orientation is taken over, even if the nitride semiconductor freestanding substrate 23 (FIG. 4(c)) having variability of in-plane off-angles in a plane is set as a seed crystal and the nitride semiconductor layer is epitaxially-grown thereon. Therefore, the freestanding substrate obtained by slicing an epitaxial layer which is grown thick, also has a variability of off-angles as a result. In addition, even if the nitride semiconductor layer 22 is grown on the nitride semiconductor substrate with uniform aligned plane direction, it warps again due to a difference in defect density of the front and back surfaces by reduction of a threading dislocation. This causes the variability of off-angles.

In order to solve the above-described problem, the present invention is provided, and an object of the present invention is to provide a method for manufacturing a nitride semiconductor substrate capable of manufacturing the nitride semiconductor substrate with small variability of off-angles.

Means for Solving the Problem

One aspect of the present invention provides a manufacturing method of a nitride semiconductor substrate, including the steps of:

forming the nitride semiconductor layer on a sapphire substrate; and manufacturing a freestanding nitride semiconductor substrate by using the nitride semiconductor layer separated from the sapphire substrate;

with variability of inclinations of the C-axes, being a difference between a maximum value and a minimum value of the inclinations of the C-axes in a radially-outward direction at each point on a front surface of the sapphire substrate, set to be 0.3° (degree) or more and 1°(degree) or less.

In the method for manufacturing the nitride semiconductor substrate of one aspect of the present invention, the inclinations of the C-axes of the sapphire substrate are preferably set to be 0.3° or smaller, at an inner side of a half of a radius on the front surface of the sapphire substrate.

Further, in the method for manufacturing the nitride semiconductor substrate of one aspect of the present invention, the C-axes of the sapphire substrate are preferably inclined in the radially-outward direction, at an outer side including the half of the radius on the front surface of the sapphire substrate.

Further, in the method for manufacturing the nitride semiconductor substrate according to one aspect of the present invention, preferably the inclinations of the C-axes of the sapphire substrate in the radially-outward direction become larger toward the outside, at the outside including the half of the radius on the front surface of the sapphire substrate.

Another aspect of the present invention provides a method for manufacturing a nitride semiconductor substrate, including the steps of:

forming a nitride semiconductor layer on a sapphire substrate; and manufacturing a freestanding nitride semiconductor substrate by using the nitride semiconductor layer separated from the sapphire substrate, with the C-axes on the front surface of the sapphire substrate are previously inclined in a radially outward direction, so as to cancel inclinations of the C-axes of the nitride semiconductor layer in a radially inward direction caused by warpage due to a difference in defect density of front/back surfaces of the separated nitride semiconductor layer.

BEST MODE FOR CARRYING OUT THE INVENTION

Preferred embodiments of a method for manufacturing a nitride semiconductor substrate according to the present invention will be described by using the drawings.

Figure 1:
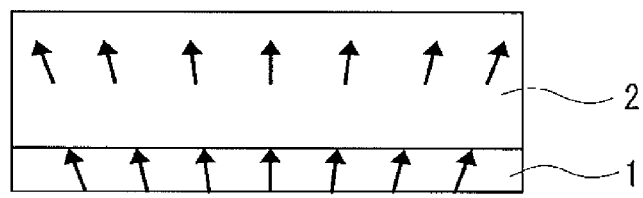
FIG. 1 is a step view schematically showing the step of a method for manufacturing a nitride semiconductor substrate according to an embodiment of the present invention.
Figure 1:
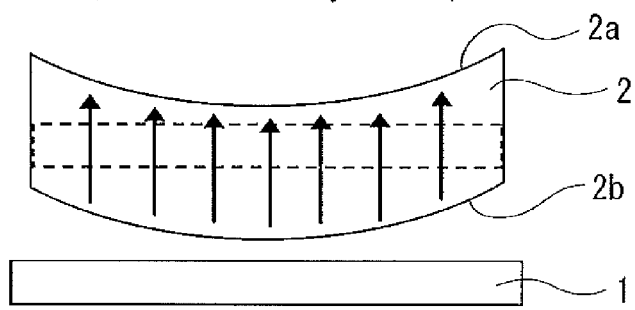
Figure 1:

FIG. 1 is a step view schematically showing the step of the method for manufacturing the nitride semiconductor substrate according to this embodiment.

In the method for manufacturing the nitride semiconductor substrate of this embodiment, first, a C-plane sapphire substrate 1 is prepared as a base substrate, and a nitride semiconductor layer 2 is formed on the C-plane sapphire substrate 1 (FIG. 1(a)).

The nitride semiconductor layer 2 is, for example, an $In_xAl_yGa_{1-x-y}N$ ($0 \leq X$, $0 \leq Y$, $0 \leq X+Y \leq 1$) layer. An organic metal vapor phase epitaxy (MOVPE method) and a hydride vapor phase epitaxy (HVPE method), or a vapor phase epitaxy combining them is used in a forming method of the nitride semiconductor layer 2.

Next, the nitride semiconductor layer 2 formed on the sapphire substrate 1 is separated from the sapphire substrate 1 (FIG. 1(b)). As a separation method (removing method), methods such as polishing and etching may be used, other than separation (as shown in the figure).

Finally, a front surface 2a and a backside surface 2b of the separated nitride semiconductor layer 2 are polished, with a broken line part of FIG. 1(b) left behind, and a cleaning process is applied thereto, to thereby produce a freestanding nitride semiconductor substrate 3 (FIG. 1(c)). Arrows in FIG. 1 shows the C-axes (main plane direction of a crystal).

Only one freestanding nitride semiconductor substrate 3 may be obtained from the separated nitride semiconductor layer 2, or a plurality of freestanding nitride semiconductor substrates may be obtained by epitaxially-growing the nitride semiconductor layer 3 thick and slicing this layer. Note that the "freestanding substrate" of the nitride semiconductor is a substrate having strength capable of withstanding substrate processing such as carrying, and the substrate has preferably a thickness of 200 μm or more.

The manufacturing method according to the aforementioned embodiment is characterized in that directions and sizes of the inclinations of the C-axes on the surface of the sapphire substrate 1, which are a base for forming the nitride semiconductor layer 2, are defined in a prescribed range.

Figure 4:
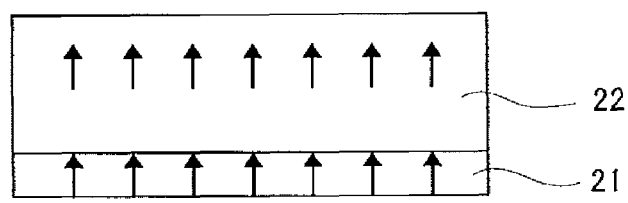
FIG. 4 is a step view schematically showing a manufacturing step for manufacturing a freestanding nitride semiconductor substrate on a conventional heterogeneous substrate.
Figure 4:
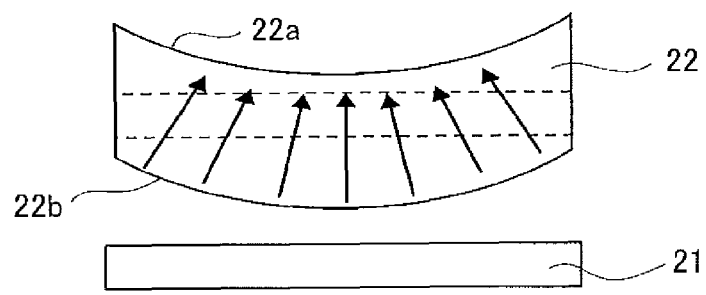
Figure 4:

As shown in FIG. 4(a), in the front surface (C-plane) of a conventionally used sapphire substrate, off-angles are small, and the C-axes are approximately vertically aligned with the front surface uniformly, and the orientation of the sapphire substrate is taken over to the nitride semiconductor layer which is epitaxially-grown on this sapphire substrate, to thereby form the C-axes in a uniformly aligned manner. However, the nitride semiconductor layer formed on the sapphire substrate has a small defect density of its front surface, and large defect density of its back surface. Therefore, internal stress inevitably works so as to warp the front surface of the nitride semiconductor layer in a concave shape. Accordingly, as shown in FIG. 4(b), the separated nitride semiconductor layer is deformed by the internal stress due to the difference in defect density, and its front surface is warped in the concave shape. Then, as shown in FIG. 4(c), in the nitride semiconductor freestanding substrate subjected to flattening process by polishing, etc, the C-axes are inclined in the radially inward direction, and in-plane variability of the off-angles is thereby caused.

Therefore, in this embodiment, by estimating the inclinations of the C-axes of the nitride semiconductor layer 2 in the radially inward direction, which is caused by warpage due to the difference in defect density of the front/back surfaces of the separated nitride semiconductor layer 2, the C-axes on the surface of the sapphire substrate 1 are made to be inclined in advance in the radially outward direction, so that the inclinations of the C-axes in the radially inward direction are canceled to thereby approximately align the C-axes in the nitride semiconductor layer 2 after separation.

Namely, as shown in FIG. 1, when the C-axes of the sapphire substrate 1 are equally inclined in a direction of canceling the inclinations of the C-axes caused by warpage due to the difference in defect density of the nitride semiconductor layer 2 after separation, the C-axes are approximately uniformly aligned, even if the warpage occurs in the nitride semiconductor layer 2 after separation, and in-plane variability of off-angles of the freestanding nitride semiconductor substrate 3 becomes small, by polishing the front surface of a concave-shaped nitride semiconductor layer 2. Thus, by defining the directions and the sizes of the off-angles of the C-axes of the sapphire substrate 1, the variability of the inclinations of the C-axes of the nitride semiconductor layer 2 after separation is controlled, and as a result, it is possible to obtain the freestanding nitride semiconductor substrate 3 with small variability of off-angles and uniformly aligned C-axes.

Although depending on growth conditions of the nitride semiconductor layer 2, the variability of the inclinations (in the radially inward direction) of the C-axes that occur in the nitride semiconductor layer 2 by the difference in defect density is about 0.3° to 0.7°. Meanwhile, by inclining the variability of the off-angles of the sapphire substrate 1 to the opposite direction (in the radially outward direction of the substrate) by 0.3° to 1°, the variability of the off-angles of the nitride semiconductor substrate 3 can be controlled to 0.3° or less, thereby causing no problem practically.

The inclinations of the C-axes in the radially inward direction caused by warpage due to the difference in defect density of the nitride semiconductor layer 2 after separation are small at a center part of the nitride semiconductor layer 2, and are larger toward the outer peripheral part.

Accordingly, in order to uniformly align the C-axes of the nitride semiconductor layer 2 after separation, the inclinations of the C-axes of the sapphire substrate 1 in the radially outward direction are preferably under 0.3°, at the inside of the half of the radius on the front surface of the sapphire substrate 1. Also, the C-axes of the sapphire substrate 1 are preferably inclined in the radially outward direction, at the outside including the half of the radius of the sapphire substrate 1 surface, and further the inclinations of the C-axes of the sapphire substrate 1 in the radially outward direction are larger toward outside, at the outside including the half of the radius on the front surface of the sapphire substrate 1.

EXAMPLES

Next, examples of the present invention will be described.

Example 1

A GaN epitaxial layer was grown on the sapphire substrate by using a Void-assisted Separation Method (VAS method), and thereafter the sapphire substrate was removed, to thereby obtain a freestanding GaN substrate, and its evaluation was performed.

The VAS method is a method of performing crystal growth by sandwiching a thin film of titanium nitride having a net structure, between the sapphire substrate and a GaN growth layer, and details of this method are described, for example, in the non-patent document 1.

A manufacturing method of the GaN freestanding substrate of this example will be described hereunder.

First, an undoped GaN layer was grown on a sapphire C-plane substrate having 2 inch diameter, with trimethyl gallium (TMG) and $NH_3$ as raw materials, by a MOVPE method, so as to have a thickness of 300 nm. Next, a Ti thin film was deposited on this GaN epitaxial substrate so as to have a thickness of 20 nm, which was then put into an electric furnace, and was subjected to heat treatment for 20 minutes at 1050 degrees, in an atmosphere of mixed gas of 20% $NH_3$ and 80% $H_2$. As a result, a part of the undoped GaN layer was etched to thereby generate voids with high density, and the undoped GaN layer was changed into a void-formed GaN layer. Simultaneously, the Ti thin film was nitrided, and was changed into a pore-formed TiN layer, with fine pores of sub-micron formed thereon with high density.

This substrate was put in a HVPE furnace, and GaN was deposited to have a thickness of 800 µm in total. A boat for housing Ga metal was heated to 900° C., and the substrate side was heated to 1100° C., and mixed gas of 5% of hydrogen and 95% of nitrogen was used as a carrier gas. HCL gas, being source gas, and a Ga melt were reacted with each other, to thereby generate GaCl, and simultaneously ammonia gas was supplied to adjust a flow rate, so that V/III ratio became 10 at the time of starting growth.

Under this condition, crystal nuclei of GaN grew into three-dimensional island shapes on the TiN layer, and subsequently crystals grown in a lateral direction were bonded with one another, thus proceeding fattening of the surface. This process was confirmed using a microscope by observing a substrate surface and a sectional surface extracted to outside the furnace, with growth time changed. GaN crystals further continued to grow by extending the growth time. After finish of the GaN crystals growth, the GaN layer was naturally separated from the base substrate of sapphire, with the void layer as a border, in a process of cooling an HVPE apparatus, and a freestanding GaN substrate with 800 µm thickness was thereby obtained.

Such a manufacture of the freestanding GaN substrate was performed, for a conventionally used normal sapphire substrate (variability of off-angles was 0.1° or less), and for the sapphire substrate of this example.

This example uses the sapphire substrate wherein variability of the inclinations of the C-axes, being a difference between a maximum value and a minimum value of the inclinations of the C-axes in the radially outward direction at each point on the front surface of the sapphire substrate (variability of the off-angles in the radially outward direction) is 0.3° or more and 1° or less, the inclinations of the C-axes of the sapphire substrate in the radially outward direction are under 0.3° at the inside of the half of the radius on the front surface of the sapphire substrate, and the C-axes of the sapphire substrate are inclined in the radially outward direction at the outside including the half of the radius on the surface of the sapphire substrate, and the inclinations of the C-axes in the radially outward direction become larger toward outside.

The freestanding GaN substrate was manufactured under the same manufacturing condition as the aforementioned condition, excluding a point that the variability of the off-angles of the used sapphire substrate was different, and the variability of the off-angles of the obtained freestanding GaN substrate was measured.

As a result, when the normal sapphire substrate (the variability of the off-angles was 0.1° or less) was used, the variability of the off-angles of the freestanding GaN substrate was 0.45°, and when the sapphire substrate of this example was used, the variability of the off-angles of the freestanding GaN substrate was 0.23° or less.

Figure 2:
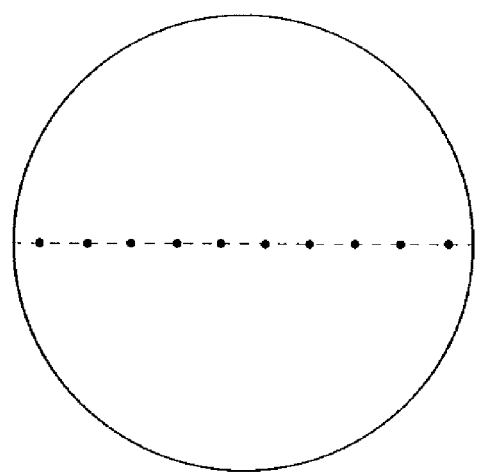
FIG. 2 is a plan view of a substrate for explaining a variability of off-angles in a front surface of the substrate.

Here, the variability of the off-angles was defined as "the maximum value of the off-angles—the minimum value of the off-angles", out of the off-angles at a plurality of points in the surface of the substrate, and the variability of the off-angles in the surface of the substrate was obtained. Specifically, an X-ray diffraction apparatus was used to measure the off-angles, and as shown in FIG. 2, the off-angles at positions of 10 points at intervals of 5 mm on a straight line passing a center of a substrate of 2 inch (50.8 mm) were measured, to thereby obtain the variability of the off-angles.

Although the variability of the off-angles of the C-axes of the sapphire substrate must be suitably selected, based on the growth condition, it was found that if the variability of the off-angles of the sapphire substrate (in the radially outward direction) was within 0.3° or more and 1° or less, the variability of the off-angles of the grown nitride semiconductor substrate could be suppressed within practically no-problematic 0.3°, under a large majority of growth conditions.

Example 2

Figure 3:
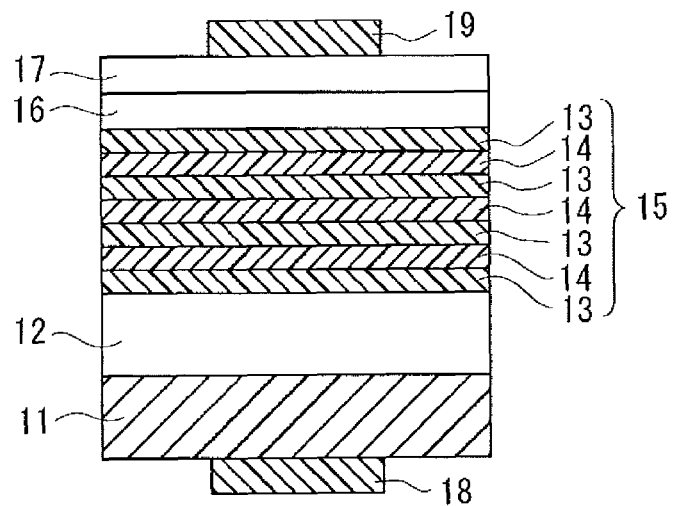
FIG. 3 is a schematic view showing a sectional structure of a nitride semiconductor light emitting device formed by using a freestanding GaN substrate manufactured in an example.

A growth layer having a light emitting structure as will be described next was formed on the GaN substrate manufactured in the example 1. FIG. 3 is a sectional view of a structure showing a nitride semiconductor light emitting device according to this example 2.

A semiconductor layer of this example 2 has a quantum well structure. A multiple layer film for light emitting diode was manufactured by the metalorganic chemical vapor deposition (MOCVD) method. As organic metal raw materials, trimethyl gallium (TMG), trimethyl aluminum (TMA), trimethyl indium (TMI), and biscyclopentadienyl magnesium ($Cp_2Mg$) were used. As hydride gas raw materials, ammonia ($NH_3$) and silane ($SiH_4$) were used. Also, as a carrier gas, hydrogen and nitrogen were used.

The semiconductor light emitting device of this example was manufactured as follows.

First, by using the freestanding GaN substrate (with different variability of the off-angles) 11 obtained by the example 1, an n-type GaN layer 12 doped Si with carrier concentration $1\times10^{19}$ $cm^{-3}$ was grown on the freestanding GaN substrate 11 at 1050° C., with a film thickness of 4 μm.

Next, an InGaN-based active layer 15 having a multiple-quantum well structure (MQW), with GaN barrier layers 13 (four layers) having 10 nm thickness, and $In_{0.1}Ga_{0.9}N$ well layers 14 (three layers) having 3 nm thickness laminated alternately, is grown as an active layer. Then, a p-type $Al_{0.1}Ga_{0.9}N$ clad layer 16 and a p-type GaN contact layer 17 are formed on the InGaN-based active layer 15 in this order.

Further, after a positive electrode 19 was formed on the p-type GaN contact layer 17 and a negative electrode 18 was formed on the backside of the GaN freestanding substrate 11, which were then made info chip.

Thereafter, the chips were selected from the same 10 points as measurement places of the off-angles shown in FIG. 2, and a light emitting wavelength of each chip was measured by EL (Electro Luminescence) measurement, to thereby obtain the variability of an emission wavelength in the surface of the substrate. Here, "the maximum value of the emission wavelength—the minimum value of the emission wavelength" is defined as the variability of the emission wavelength.

Regarding all samples manufactured in this example, a result of measuring the variability of the emission wavelength is shown in table 1. As shown in table 1, the obtained result was that the variability of the emission wavelength was small in the sample in which the variability of the off-angles was small.

TABLE 1

| Variability of off-angles in a front surface of a freestanding substrate (°) | Variability of emission wavelength (nm) |
| --- | --- |
| 0.05 | 5.2 |
| 0.09 | 6.1 |
| 0.165 | 10.0 |
| 0.185 | 12.2 |
| 0.195 | 12.8 |
| 0.215 | 13.6 |
| 0.225 | 15.6 |
| 0.33 | 26.0 |
| 0.375 | 32.0 |

What is claimed is:

1. A method for manufacturing a nitride semiconductor substrate, comprising the steps of:
   forming a nitride semiconductor layer on a circle-like sapphire substrate having a flat front surface; and
   manufacturing a freestanding nitride semiconductor substrate by using the nitride semiconductor layer separated from the sapphire substrate, wherein
   C-axis at each point of the sapphire substrate is inclined in a radially-outward direction with respect to a normal line of the front surface, in an outside area including a half of a radius from a center of the front surface of the sapphire substrate,
   inclinations of the C-axes of the sapphire substrate in the radially-outward direction are smaller than 0.3°, in an inside area of the half of the radius from the center of the front surface of the sapphire substrate, and
   a variability of the inclinations of the C-axes, being a difference between a maximum value and a minimum value of an inclination of the C-axis in the radially-outward direction at each point in an overall area of the front surface of the sapphire substrate is 0.3° or more and 1° or less.

2. The method for manufacturing the nitride semiconductor substrate according to claim 1, wherein the inclinations of the C-axes of the sapphire substrate in the radially-outward direction become larger toward outside of the sapphire substrate, in the outside area including the half of the radius of the front surface of the sapphire substrate.

3. A method for manufacturing a nitride semiconductor substrate, comprising the steps of:
   forming a nitride semiconductor layer on a circle-like sapphire substrate having a flat front surface; and
   manufacturing a freestanding nitride semiconductor substrate by using the nitride semiconductor layer separated from the sapphire substrate, wherein
   the sapphire substrate is formed so that the C-axes of the front surface and normal lines of the front surface coincide with each other at a center portion of the front surface of the sapphire substrate, and the C-axis at each point of the front surface is inclined in a radially-outward direction with respect to the normal line of the front surface at outside of the center portion of the front surface of the sapphire substrate, and inclinations of the C-axes in the radially-outward direction become larger toward the radially outward direction of the sapphire substrate, so as to cancel inclinations of the C-axes of the nitride semiconductor layer in a radially-inward direction caused by warpage due to a difference in defect density of front/back surfaces of the separated nitride semiconductor layer.

* * * * *